United States Patent [19]

Kock et al.

[11] 4,328,324

[45] May 4, 1982

[54] PROCESS FOR THE TREATMENT OF AROMATIC POLYAMIDE FIBERS, WHICH ARE SUITABLE FOR USE IN CONSTRUCTION MATERIALS AND RUBBERS, AS WELL AS SO TREATED FIBERS AND SHAPED ARTICLES REINFORCED WITH THESE FIBERS

[75] Inventors: Theodorus J. J. M. Kock, Rotterdam; Jacobus J. G. Smits, Waddinxveen, both of Netherlands

[73] Assignee: Nederlandse Organisatie voor Tiegeoast- Natyyrwetebscgaooekuhj Ibderziej ten behoeve van Nijverheid Handel en Verkeer, The Hauge, Netherlands

[21] Appl. No.: 47,882

[22] Filed: Jun. 12, 1979

[51] Int. Cl.³ .......................... B29H 9/02; C08F 2/52; B60C 9/00
[52] U.S. Cl. ................................... 525/423; 204/165; 204/168; 264/176 F; 264/22; 156/110 C; 152/356 R
[58] Field of Search ................. 204/165, 168; 8/DIG. 12, DIG. 21; 264/DIG. 45, DIG. 46, 22; 152/356; 156/110 C; 525/423

[56] References Cited

U.S. PATENT DOCUMENTS

| | | | |
|---|---|---|---|
| 2,991,818 | 7/1961 | Gay et al. | 152/356 |
| 3,160,192 | 12/1964 | Drew | 152/355 |
| 3,253,637 | 5/1966 | Liska | 156/110 C X |
| 3,309,299 | 3/1967 | Mantell | 204/165 |
| 3,399,252 | 8/1968 | Hough et al. | 264/27 |
| 3,600,350 | 8/1971 | Kwolek | 152/357 R |
| 3,817,941 | 6/1974 | Bair et al. | 528/348 |
| 3,870,610 | 3/1975 | Baird et al. | 204/165 |

FOREIGN PATENT DOCUMENTS 1936852 1/1970 Fed. Rep. of Germany .
2144663 2/1973 France .

Primary Examiner—F. Edmundson
Attorney, Agent, or Firm—Hammond & Littell, Weissenberger and Muserlian

[57] ABSTRACT

A process for the treatment of aromatic polyamide fibers, which are suitable for use in construction materials and rubbers, as well as so treated fibers and shaped articles strengthened with these fibers.

2 Claims, 1 Drawing Figure

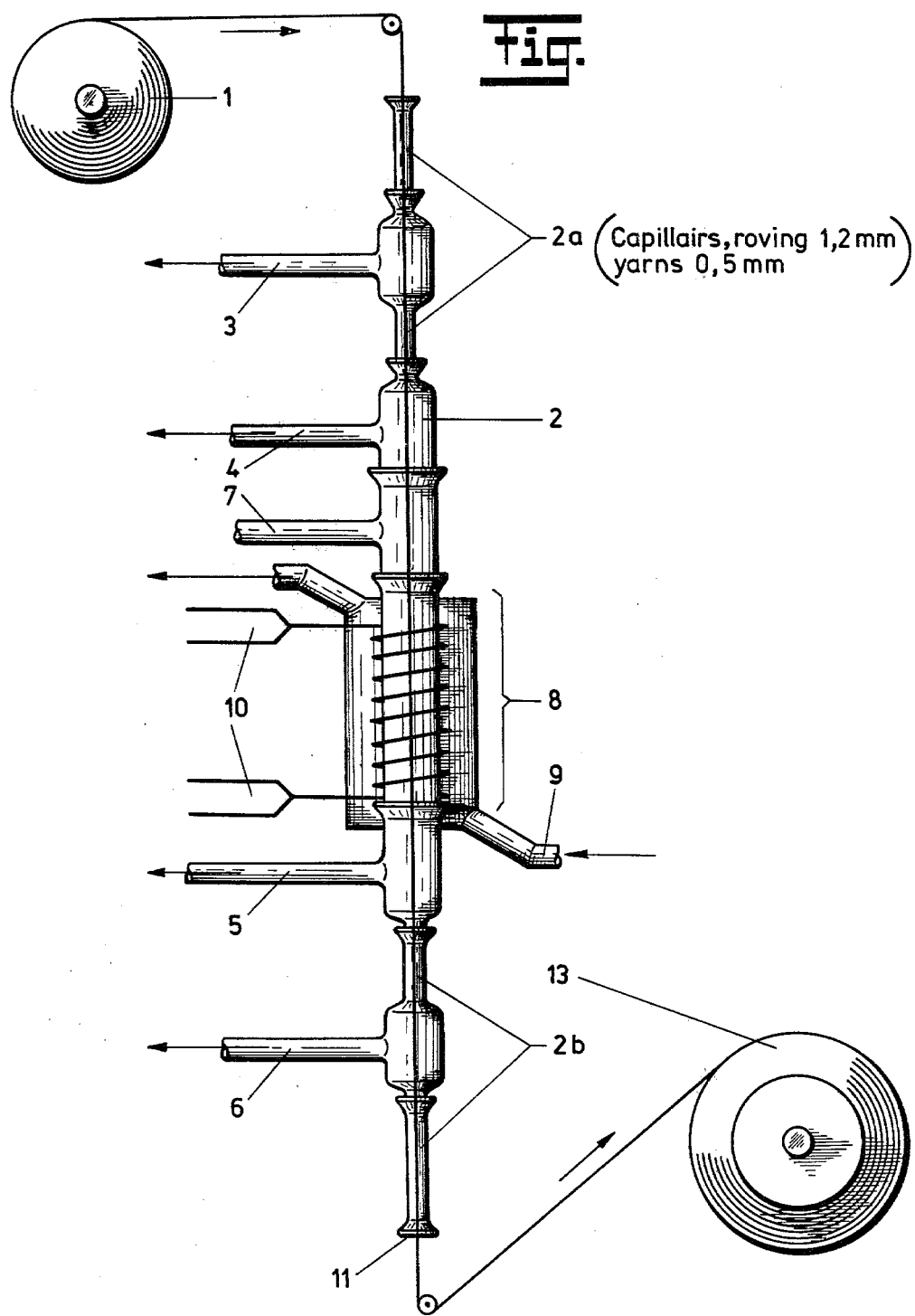

PROCESS FOR THE TREATMENT OF AROMATIC POLYAMIDE FIBERS, WHICH ARE SUITABLE FOR USE IN CONSTRUCTION MATERIALS AND RUBBERS, AS WELL AS SO TREATED FIBERS AND SHAPED ARTICLES REINFORCED WITH THESE FIBERS

The invention relates to a process for the treatment of aromatic polyamide fibers, which are suitable for use in construction materials and rubbers, on the so treated fibers and on shaped articles reinforced with these fibers.

From the U.S. Pat. No. 3,309,299 it is known, that among others certain aliphatic polyamides, like capran and nylon, have a poor adhesion for substances like printing ink, paint, lacquer and glue types. According to said U.S. Patent Specification one has tried to improve this by treatments of the surface in a chemical or thermal way and by means of corona discharge. Said methods, however, have disadvantages; especially it applies for the corona discharge, that the surface of the plastic has to be free of dust particles and other impurities and moreover the surface has to be perfectly flat. The said U.S. Patent Specification meets these disadvantages by passing oxygen, nitrogen or air through an area, wherein an electrical discharge takes place, so that said gas is at least partly dissociated into free atoms. A stream containing said dissociated gas is impinged on the surface of the article to be treated, like foils, fibers or cloth, so long that the surface has been activated in the desired degree; herein a chemical modification of the surface of the non-polar resin takes place, which is determined by measuring the weight loss of the article. The so obtained article has good adhesion properties for the above mentioned materials, as can be seen from peel-tests. The treatment of the plastic may be carried out continuously and the treated article can be stored for several weeks without a decrease of this effect.

Dutch Patent Application No. 66,12815 describes the adherent connecting with each other of thermoplastic materials, like linear polyamides, for example nylon. The adherence is poor without modification of the surface. Therefore it is proposed to treat articles from these thermoplastic materials which have to be connected adherently to each other with an adherent agent, by bombing with a stream of an excited gas, like a noble gas, nitrogen, oxygen, hydrogen or a mixture thereof. The treated materials are thereafter adherently connected with the usual agglutinants for example on epoxy basis. The resistance against tensile and shear strength of the products is good.

It has, however, appeared that the above, treated or not aliphatic polyamide fibers cannot be used as reinforcing fibers in construction materials on the basis of thermosetting plastics and rubbers, as well as in thermoplastics, because they behave themselves as thermoplastics, are deformable at high temperature and break at an elongation of 20-30%, while the E-modulus is insufficiently high.

From "Kunststoffe", Band 63, 1973, H. 12, pages 919-923 it is known that aromatic polyamide fibers do not behave as thermoplastics and have an elongation of about 2%.

The preparation of aromatic polyamides and fibers prepared herefrom is known per se from the U.S. Pat. Nos. 3,600,350 and 3,817,941.

Further the aromatic polyamide fibers are in contradiction with the aliphatic polyamide fibers not meltable and not sprayable, the fibers can only be obtained by spinning, among others from strongly concentrated sulphuric acid and direct stretching, because this is later not possible anymore. Though it is surprising that although aliphatic and aromatic polyamides belong to a corresponding class of polyamides, the properties and uses of both substances are so greatly different.

On the basis of the differences in properties aromatic polyamide fibers are used in construction materials but not aliphatic polyamide fibers.

Because of the high E-modulus (primary condition for a reinforcing fiber is, that the E-modulus of the fiber is higher than from the matrix) makes the aromatic polyamide fiber especially suitable for the use in combination with thermosetting plastics and rubbers. For the optimal utilizing of the strength properties, especially in use as reinforcing fiber for thermosetting plastics, also the low elongation of the aromatic polyamide fiber is important.

As reinforcing fiber in construction materials it is up to now generally known to use glass fibers. These are very strong but the elasticity modulus (stiffness of the fiber) is relatively low; graphite fibers are better in this respect, but very expensive. The following table gives the properties of said fibers in comparison with aromatic polyamide fibers:

|  | glass fiber | graphite fiber | aromatic polyamide fiber |
| --- | --- | --- | --- |
| tensile strength N/mm$^2$ | 1500–2450 | 2300–2900 | 2700 |
| E-modulus N/mm$^2$ | 73000 | 175000–350000 | 130000 |
| density | 2.55 | 1.8 | 1.45 |
| elongation at break % | 2–4 | 1 | 2.4 |

Vide also the above mentioned publication in "Kunststoffe", which further mentions that Kevlar-49 (trade name Du Pont for Aramid-fibers) is very suitable for reinforcing synthetic resins, but that the adhesion with for example epoxyresin is not good. The Kevlar-49 fibers can also be used together with graphite and/or glass fibers.

The Journal of Applied Polymer Science, vol. 20 (1976), pages 435–448 describes also the use of Kevlar-49 fibers for reinforcing thermoplastics. Also this publication describes the poor adherence between the fiber and the matrix material. In experiments to improve said adherence to a non-treated fiber, a fiber finished with Du Pont 5259-18 and a fiber treated in boiling water are compared with each other. The finished fiber appeared to give the best adherence with the matrix material, while the fiber treated with water came on the second place.

Also the publication "Organic-fibre/epoxide-composites" in Composites, January 1973, describes the Kevlar-49 fiber (here mentioned as PRD-49-III). This one is compared in an epoxy resin with S-glass fiber in the same resin, wherein the epoxy resin with the Kevlar-49 fiber in comparison with the product with the S-glass fiber has a higher ratio of strength and modulus with respect to the density; under load the Kevlar-49 fiber maintains longer the same break strength under prolonged load. The time to break is for example for strands from organic fiber/epoxide at a load of 90% of the final strength thereof about the same as that of strands of S-glass/epoxide at a load of 81% of the final strength thereof.

The precise chemical composition of PRD-49 or Kevlar-49 fiber is not known. According to J. Appl. Pol. Sc. 20, 1976, page 438, it probably consists of poly(p-phenylene-terephthalamide). Kunststoffe, Band 63, 1973, H.12 only mentions that it is an aromatic polyamide and according to "Organic-fibre/epoxide-composites" in Composites, January 1973, page 31, left column, the structure is presumably poly-p-benzamide.

Further U.S. Pat. No. 3,652,510 describes the preparation of poly(p-benzamide) (cf. the above publication in Composites, January 1973) in the form of particles, smaller than 10 μm, which are used as reinforced agent for textile denier filaments and further in bars, foils and panels. The advantage is, that the so reinforced materials have a higher initial modulus and resistance against creep. The use of poly-p-benzamide in compositions suitable for fibers is known from the Belgian Patent No. 733,061. The preparation and use of poly-p-benzamides for extrusion, casting of films and the preparation of fibrils is described in French Pat. No. 1,526,745.

The U.S. Pat. No. 3,884,989 describes the use of poly(p-benzamide) as reinforcing agent for for example polyamides, polyesters, polyacrylic compounds and Spandex (RTM) polymers. The reinforced materials have a higher modulus and a better resistance against humidity and heat than the non-reinforced materials.

Finally U.S. Pat. No. 3,943,110 describes the preparation of fibers and foils from poly-(p-benzamides) which are halogenated in the nucleus, by spinning the solution of the polymers from concentrated sulphuric acid, or casting of said solutions respectively.

In view of the favourable properties of aromatic polyamide fibers for use in construction materials one has tried to improve the adherence properties, which of course are very important for composites. So the above mentioned publication in J. Appl. Pol. Sc. 20, 1976, pages 435–448 describes the treatment of the fibers with a finish (Du Pont 5259–18).

The applicants have tried to improve the adherence of the matrix with the fibers by pre-treatment of the fibers according to a number of techniques known for plastics, as with ozon (U.S. Pat. Nos. 3,723,706-S and 2,715,075) and hydrogen peroxide ("Kunststoff-Galvanisierung", Eugen G. Leuze Verlag, page 47). The adherence with the fibers was indeed improved by said treatments, but the strength thereof was decreased.

Now a process was found for the improvement of the adherence properties of aromatic polyamide fibers, the strength of which is not decreased and which are suitable for use in construction materials. Said process is characterized in that the fibers are passed via one or more capillary entrances and outlets through an area, wherein a reduced pressure is maintained and wherein a plasma is effected by means of a high frequency electrical field obtained via a solenoid placed around said area.

With respect to the so called plasma treatment of polymers reference is made to: Adhesive Age, March 1972, pages 37–40; European Plastics News, January 1975, page 17, I. R. Hollahan and A. T. Bell "Techniques and applications of Plasma Chemistry", New York, Wiley 1974, and G. H. Brown, C. N. Haylor and R. A. Bierwith, "Theory and applications of radio-frequency heating", New York, van Nostrand, 1948, 2nd printing.

It was found, that according to said process the adherence of the aromatic polyamides with a plastic matrix and via one or more interlayers also with rubbers is considerably improved, while the other properties are hardly influenced; especially the tensile strength of the non-treated aromatic polyamide fiber is 3520 N/mm$^2$ and of that fiber after plasma treatment 3490–3600 N/mm$^2$. So a fiber is obtained which has in comparison with for instance glass fiber about the same good tensile strength, but an elasticity modulus (stiffness) which is about two times as high and which fiber has a sufficient adherence with the matrix.

The invention further relates to a shaped article, which has been reinforced with the so treated fibers.

Presently available aromatic polyamide fibers, which can especially be used in the process according to the invention, are "Kevlar-29" and "Kevlar-49" of Du Pont, as well as "Arenka" of AKZO. The structure formulae are not indicated by these fabricants (cf. the brochure of Du Pont: "Properties and uses of Kevlar-29 and Kevlar-49 aramid fibers and of reinforced composites of Kevlar-49", Conference given to reinforced plastics symposiums, England and Sweden, May 1976).

The aromatic polyamide fibers obtained according to the process of the invention with strongly improved adherence properties can be used as reinforcing in matrix materials, like unsaturated polyesters, polyurethanes, epoxy resins and rubbers and also other thermosetters and even thermoplastics.

The treated fibers can be used together with glass and carbon fibers.

The construction materials reinforced with the fibers obtained according to the process of the invention can be used for a large number of uses, wherein the combination of a low density and a high strength, stiffness and resistance against corrosion are important, namely in the aereal and spatial uses, sport articles, ultracentrifuges, fly wheels and for the reinforcing of motor tires.

By the treatment of the fibers with the plasma a chemical modification of the surface takes place, which is a kind of modification which is dependent on the composition of the fiber and the treatment conditions, among with the type of gas which is used in the forming of the plasma. The obtained fibers are not sticky and are resistant to storage.

The apparatus for the treatment of the fibers according to the process of the invention is indicated in the companying FIGURE. The fiber is unwound from reel 1 and passed through tube 2 with capillaries 2a and 2b. Through said capillaries wherein per capillary a pressure decrease takes place, the fiber bundle is passed into and also out of the vacuum tube. In said tube a gas plasma is generated with a bobbin placed around said tube. For the generation of the high frequency alternating field in the bobbin for example use is made of the apparature of Hermann-Moritz with a relatively low capacity.

According to an embodiment of the process according to the invention in plasma tube 8 without plasma, but by continuous passing of roving with four separately working pumps 3,4,5 and 6 an absolute pressure of 1.5 mm mercury is attained. By generation of the plasma and the hereby occurring chemical phenomenons the pressure during the treatment of the fibers increases to 3–5 mm mercury.

Plasma tube and bobbin are cooled with air 9. The bobbin is moreover internally cooled with water (10).

Directly to the plasma tube a T-accessory 7 is connected through which the pressure in said tube can be measured. Via said branching 7 moreover the pressure in the tube can be adjusted by introduction of air. It is also possible to use instead of air for example noble gases $N_2$, $O_2$, $CO_2$, $SO_2$ and NO. With winding reel 13 the roving or the yarn are drawn through the capillaries 5 and the plasma tube. The diameter of the capillaries is dependent on the diameter of the roving or yarn.

With the use of said apparatus the process according to the invention can be advantageously carried out continuously.

The invention is further illustrated by means of the following tables A and B, wherein the interlaminary shear strength after the plasma treatment is indicated as measure for the adherence.

TABLE A

Influence of gastype in plasma pretreatment on the shear strength.

Material combination

| Fiber treatment of the aromatic polyamide fiber | | Shear strength $N/mm^2$ |
|---|---|---|
| — | Epoxy A | 54 |
| air plasma | " | 67,3 |
| oxygen plasma | " | 66,9 |
| nitrogen plasma | " | 66,8 |
| $CO_2$—plasma | " | 64,8 |
| $SO_2$—plasma | " | 65,6 |
| NO—plasma | " | 63,5 |
| argon-plasma | " | 62,7 |

TABLE B

Influence of matrix system on the shear strength in plasma pretreated aromatic polyamide fibers.

| fiber treatment | matrix | shear strength $N/mm^2$ |
|---|---|---|
| — | unsaturated polyester | 35 |
| — | Epoxy A | 54 |
| — | Epoxy B | 64,5 |
| — | Epoxy C | 55 |
| — | Epoxy D | 64 |
| air plasma | Epoxy A | 67,3 |
| " | Epoxy B | 70,3 |
| " | Epoxy C | 69,9 |
| " | Epoxy D | 63,4 |
| " | Epoxy E | 71,2 |

A = epoxy resin + acid anhydride as curing agent
B = epoxy resin + acid anhydride as curing agent
C = epoxy resin + aromatic amine as curing agent
D = epoxy resin + $BF_3$ complex as catalyst
E = epoxy resin + aromatic amine as curing agent A fiber which has been subjected to a plasma pretreatment can be stored for a long time in the air after said treatment. Moisture has no influence on the treatment effect. Before embedding in a matrix the fiber, however, has to be dried which is also necessary with non-treated fiber.

We claim:

1. Aromatic polyamide fiber treated by drawing polyamide fibers through at least one capillary entrance and outlet through a tube wherein a reduced pressure is maintained and wherein a plasma is generated by means of a high frequency field caused by a solenoid placed around said area.

2. Shaped article made of a plastic or rubber matrix material containing a fiber of claim 1 as a reinforcing agent.

* * * * *

UNITED STATES PATENT AND TRADEMARK OFFICE
CERTIFICATE OF CORRECTION

PATENT NO. : 4,328,324
DATED : May 4, 1982
INVENTOR(S) : THEODORUS J. J. KOCK et al

It is certified that error appears in the above—identified patent and that said Letters Patent is hereby corrected as shown below:

Title page [73]: The name and address of the assignee should read:

-- Nederlandse Centrale Organisatie voor Toegepast-Natuurwetenschappelijk Onderzoek, The Hague, Netherlands. --

Title Page: Please insert

-- (30) Foreign Application Priority Data

June 14, 1978   Netherlands....78-06452   --.

Signed and Sealed this

Second Day of November 1982

[SEAL]

Attest:

GERALD J. MOSSINGHOFF

Attesting Officer    Commissioner of Patents and Trademarks